US005615172A

United States Patent [19]

Kotlyar

[11] Patent Number: 5,615,172

[45] Date of Patent: Mar. 25, 1997

[54] AUTONOMOUS DATA TRANSMISSION APPARATUS

[76] Inventor: Oleg M. Kotlyar, 4675 W. 3825 S, Salt Lake City, Utah 84120

[21] Appl. No.: 636,175

[22] Filed: Apr. 22, 1996

[51] Int. Cl.$^6$ .............................. G01V 1/40; H01L 11/04

[52] U.S. Cl. ........................... 367/83; 367/156; 367/168; 367/912; 181/106; 175/1

[58] Field of Search ............................... 367/83, 85, 154, 367/156, 159, 168, 912; 181/106; 175/1; 173/14; 166/113, 249, 250

[56] References Cited

U.S. PATENT DOCUMENTS

| | | | |
|---|---|---|---|
| 4,685,091 | 8/1987 | Chung et al. | 367/912 |
| 4,722,417 | 2/1988 | Selsam | 367/912 |
| 4,869,338 | 9/1989 | Wiggins et al. | 181/106 |
| 5,063,542 | 11/1991 | Petermann et al. | 181/106 |
| 5,069,308 | 12/1991 | Yin et al. | 181/106 |
| 5,115,880 | 5/1992 | Sallas et al. | 367/166 |
| 5,130,953 | 7/1992 | Grosso | 367/156 |
| 5,414,397 | 5/1995 | Kiesewetter | 367/156 |
| 5,534,668 | 7/1996 | Ogura | 181/106 |

*Primary Examiner*—Nelson Moskowitz
*Attorney, Agent, or Firm*—Alan Kirsch

[57] ABSTRACT

A autonomous borehole data transmission apparatus for transmitting measurement data from measuring instruments at the downhole end of a drill string by generating pressure pulses utilizing a transducer longitudinally responsive to magnetic field pulses caused by electrical pulses corresponding to the measured downhole parameters.

19 Claims, 4 Drawing Sheets

AUTONOMOUS DATA TRANSMISSION APPARATUS

CONTRACTUAL ORIGIN OF THE INVENTION

United States Government has rights in this invention pursuant to Contract No. DE-AC07-94ID13223 between the United States Department of Energy and Lockheed Idaho Technologies Company.

BACKGROUND OF INVENTION

The present invention relates to a borehole data transmission apparatus and more particularly to a borehole data transmission apparatus utilizing a transducer longitudinally expansive in response to magnetic field pulses for generating pressure pulses in a borehole through drilling mud to the surface of the earth.

It is well known to transmit measurement data from a measuring instrument at the downhole end of a drill string within a borehole by generating pressure variations within the mud flow passing along the drill string and retrieving the transmitted data by sensing such pressure variations at the surface. Typically such data includes weight on the bit, RPM, natural gamma, formation resistivity, bottom hole temperature, bottom hole pressure, and virtually any information related to detectable conditions. Such information is usually transmitted from the bottom of the borehole to the surface as a series of hydraulic pulses produced in, and transmitted through, the drilling fluid. At the surface, the pressure signals are detected, usually converted to electrical signals, and processed to provide information in a useable format.

It is common to create pressure pulses in drilling fluid by periodically restricting the passage of drilling fluid flowing through the drill string, or periodically diverting a portion of the flow into the annulus of the drill string, to form a series of pulses in the drilling fluid which is normally pressurized and which normally flows down through the drill string and back up the annulus around the outer surface of the drill string.

Thus, for example, a variety of systems have been used to form the pressure pulses and to effect transmission to the surface. In most instances, the pulsing system involves some form of valve so positioned that the entire fluid flow through the drill string also flows through the valve.

It is known to use rotary "turbine-like" valves which include a rotor and a stator. Both the rotor and stator have slots which can be aligned to completely open the valve and let drilling fluid pass through without any obstruction, or can be misaligned to partially close the valve and provide a strong resistance to the passing of the drilling fluid. Turbines have also been used for generating the electrical power needed to operate the logging-while-drilling systems.

The recognized difficulty with conventional techniques for generating pressure pulses using valves and turbine-like valves is the limited service life of the apparatus caused by the drilling fluid. The drilling fluid, due to its composition and the rate of flow, tends to be quite abrasive. As a result of the abrasive conditions of the drilling fluid and the fact that the transmission of data may involve a significant number of pulses, the life of the valves is limited. Additionally, conventional downhole data transmission devices utilizing valves and turbine-like valves must have a relatively complex design and at least two parts (i.e. puppet valve and seat, or rotor and stator) working in the drilling fluid in order to generate the required pressure pulses. Still another difficulty with conventional telemetry systems is the poor quality of the pressure signals received at the surface due to the high noise level inside the drilling fluid column.

It is an object of the present invention to provide an autonomous, simple, inexpensive borehole data transmission device with sensitive components that are completely isolated from the abrasive flow of drilling mud thereby prolonging the service life of the borehole data transmission device.

It is another object of the present invention to provide a borehole data transmission device having a high data transmission rate.

It is still a further object of this invention to provide a borehole data transmission device capable of providing improved signal reception at the surface.

It is still another object of the present invention to provide a borehole data transmission device that does not require the flow of drilling fluid to generate pressure pulse signals.

Additional objects, advantages and novel features of the invention will become apparent to those skilled in the art upon examination of the following and by practice of the invention.

SUMMARY OF THE INVENTION

The above and other objects are achieved in accordance with the present invention by downhole data transmission device comprising:

(a) electrical means for providing electrical power for the downhole data transmission device;

(b) sensor means for measuring downhole physical conditions, said sensor means being in electrical communication with said electrical means;

(c) a sealed housing having a flexible membrane at an end proximate to the earth's surface, said sealed housing containing an internal fluid pressurized at a substantially equal pressure to an ambient drilling fluid pressure in the borehole;

(d) a pulser transmitter within said sealed housing, said pulser transmitter having first and second ends and a longitudinal axis from said first to second ends, said first end of the pulser transmitter being removably secured to the housing, said pulser transmitter being comprised of a material capable of rapidly expanding longitudinally in response to the presence of a magnetic field and being further capable of rapidly contracting longitudinally to its original dimension in the absence of the magnetic field;

(e) an electrically conductive coil in radial proximity around said pulser transmitter between said pulser transmitter first and second ends;

(e) controller means, in electrical communication with said sensor means and electrical means, for providing electrical pulses through said electrically conductive coil, said electrical pulses corresponding to the measured downhole physical conditions and being of sufficient magnitude to create a corresponding magnetic field pulse of a sufficient magnitude to cause the pulser transmitter to expand and contract longitudinally in the presence and absence, respectively, of the magnetic field pulse, said longitudinal expansion and contraction of the pulser transmitter creating pressure pulses in the internal pressurized fluid that are transmitted through the flexible membrane to the drilling fluid and detectable at the earth's surface.

In an alternate embodiment of the invention the magnetostrictive material is directly connected to the flexible membrane, while in still another embodiment, mechanical means are utilized to transfer the volumetric expansion from the magnetostrictive material to the flexible membrane.

DETAILED DESCRIPTION OF THE INVENTION

Figure 1:
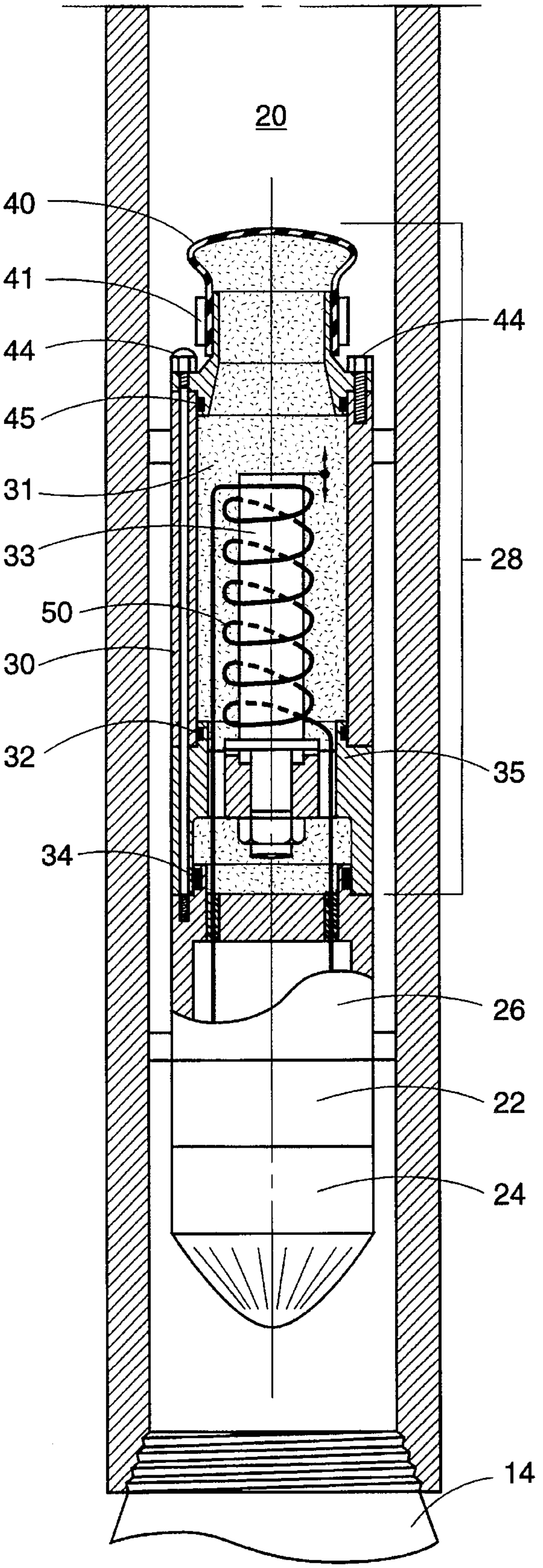
FIG. 1 is an elevational view, partly in section, of the autonomous data transmission apparatus of the present invention.

Referring to FIG. 1 the autonomous data transmission apparatus of the present invention is shown. The autonomous data transmission device 20 is secured within a drill collar 12 which forms the lower end of a drill string near drill bit 14. The autonomous data transmission device 20 comprises a sensor block 22, battery block 24, pulser controller block 26 and pulser transmitter 28. Sensors (not shown) are located within the data transmission device housing 30 and are capable of measuring desired downhole parameters including inclination, azimuth, tool face orientation, resistivity of drilling formations, weight on the bit, natural gamma radiation, bottom hole temperature, bottom hole pressure and any other detectable parameters. Electrical energy is provided to the sensor block 22 from the battery block 24. Battery block 24 also provides electrical energy to the pulser controller block 26 which is in electrical communication with the pulser transmitter block 28. In an alternate embodiment of the invention, a turbine can be substituted for the battery block.

The pulser controller block 26 consists of an electronic package capable of converting the data provided by the sensors into electrical pulses. In a preferred embodiment of the present invention, the frequency of the electrical pulses from the pulser controller block is between 10 and 100 Hz. Electrical pulses are caused by the controller block switching between "on" and "off" positions. Such electronic switching can be achieved through electronic or integrated circuits to eliminate any physically moving parts in the autonomous borehole data transmission device.

Pulser transmitter block 28 consists of a cavity within housing 30, such cavity being filled with a liquid 31, such as oil for example (hereinafter called "internal fluid"). Means are also provided for balancing the pressure of the internal fluid filling the cavity relative to the ambient pressure that exists outside the housing. The fluid filled cavity is sealed from the controller block 26 by O-ring 34. At the end of the autonomous data transmission apparatus 20 proximate to the earth's surface, a flexible diaphragm 40 is secured to the data transmission apparatus 20 by means of clamp 41 and multiple bolts 44. An optional O-ring 45 can also be used to completely seal the internal fluid 31 from the external drilling fluid (i.e. drilling mud). Obviously other means of securing the flexible diaphragm 40 to the autonomous data transmission apparatus 20 could be used, however, it is preferred that the flexible diaphragm 40 is easily removable from the autonomous data transmission apparatus 20 to facilitate servicing and replacement of the components within the pulser transmitter block 28.

Within the cavity is a transducer which works as a pulse generator and consists of a bar 33 of magnetostrictive material having the capability of rapidly expanding along its longitudinal axis when exposed to a magnetic filed caused by an electrical current pulse which is provided from the pulser controller block 26 through coil 50, and rapidly contracting to its original length when no current pulse flows through the coil 50. As can be seen in FIG. 1, one end of the magnetostrictive bar 33 is secured to an intermediate wall 35 of the pulser transmitter 28. Preferably the pulser transmitter consists of a magnetostrictive material (e.g. TERFENOL-D) that expands longitudinally when in the presence of a magnetic field created by the electrical current through coil 50 although it should be appreciated that volumetric expansion in any direction (e.g. radially) will also create a desired pressure pulse within the internal fluid 31. This pressure pulse within the internal fluid is then transferred to the ambient drilling fluid through the flexible diaphragm. The pulse then travels through the drilling fluid to the surface where a pressure transducer receives the pressure pulse and feeds it to an electronic pulse detection scheme for conversion to a readable format. Other volumetrically expansive materials such as piezoelectric and electrostrictive materials can also be used in the subject invention.

Figure 2:
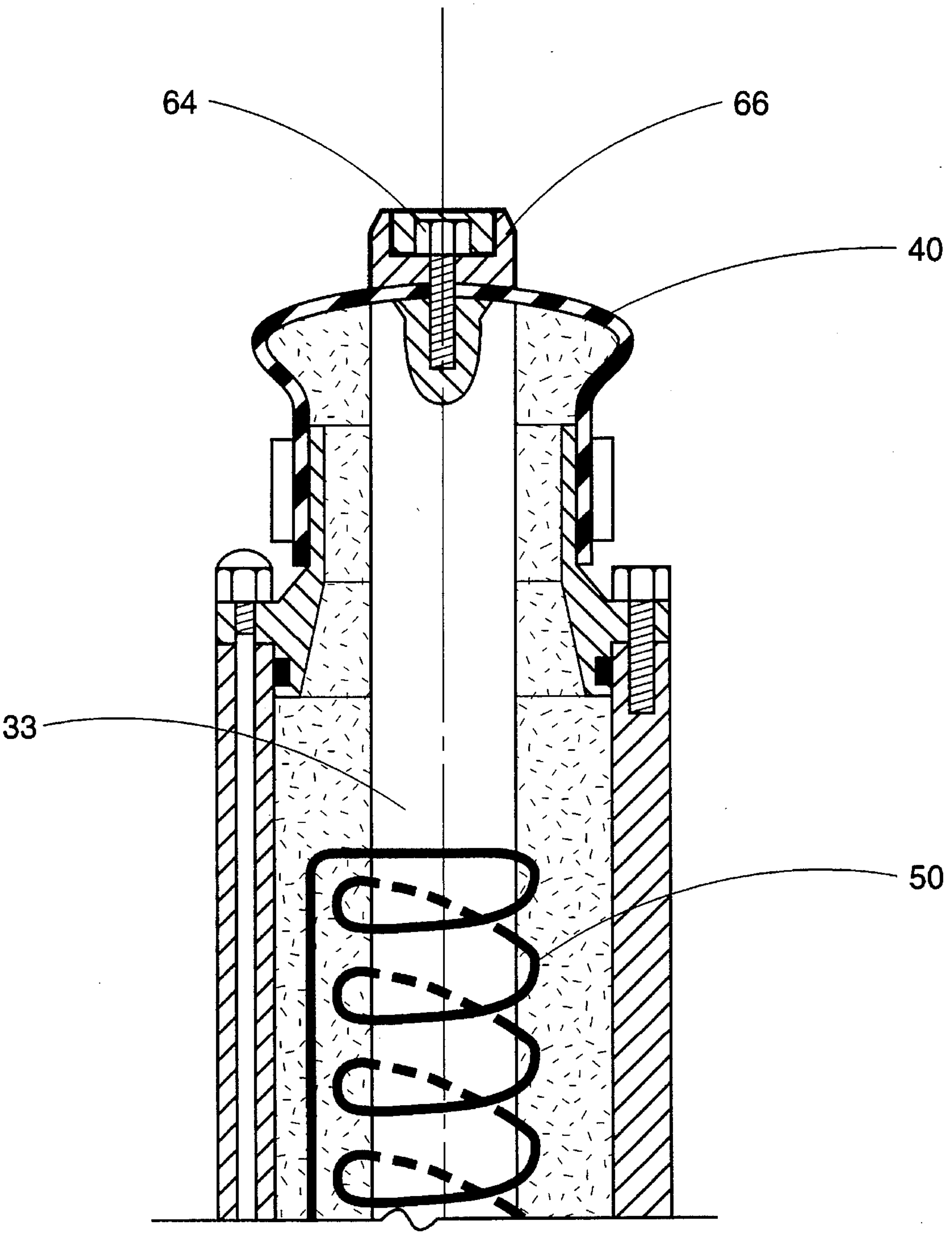
FIG. 2 is an elevational and sectional view of an alternate embodiment of the present invention.

Referring now to FIG. 2 in which like numbers are utilized from FIG. 1, an alternate embodiment of the invention is shown wherein the pulser transmitter 28 consisting of a magnetostrictive bar 33 is directly connected to the flexible diaphragm 40 by means of screw 64 and screw holder 66 thereby generating pulses directly in the ambient drilling fluid. Other means of attaching the magnetostrictive bar to the flexible diaphragm can also be used.

Figure 3:
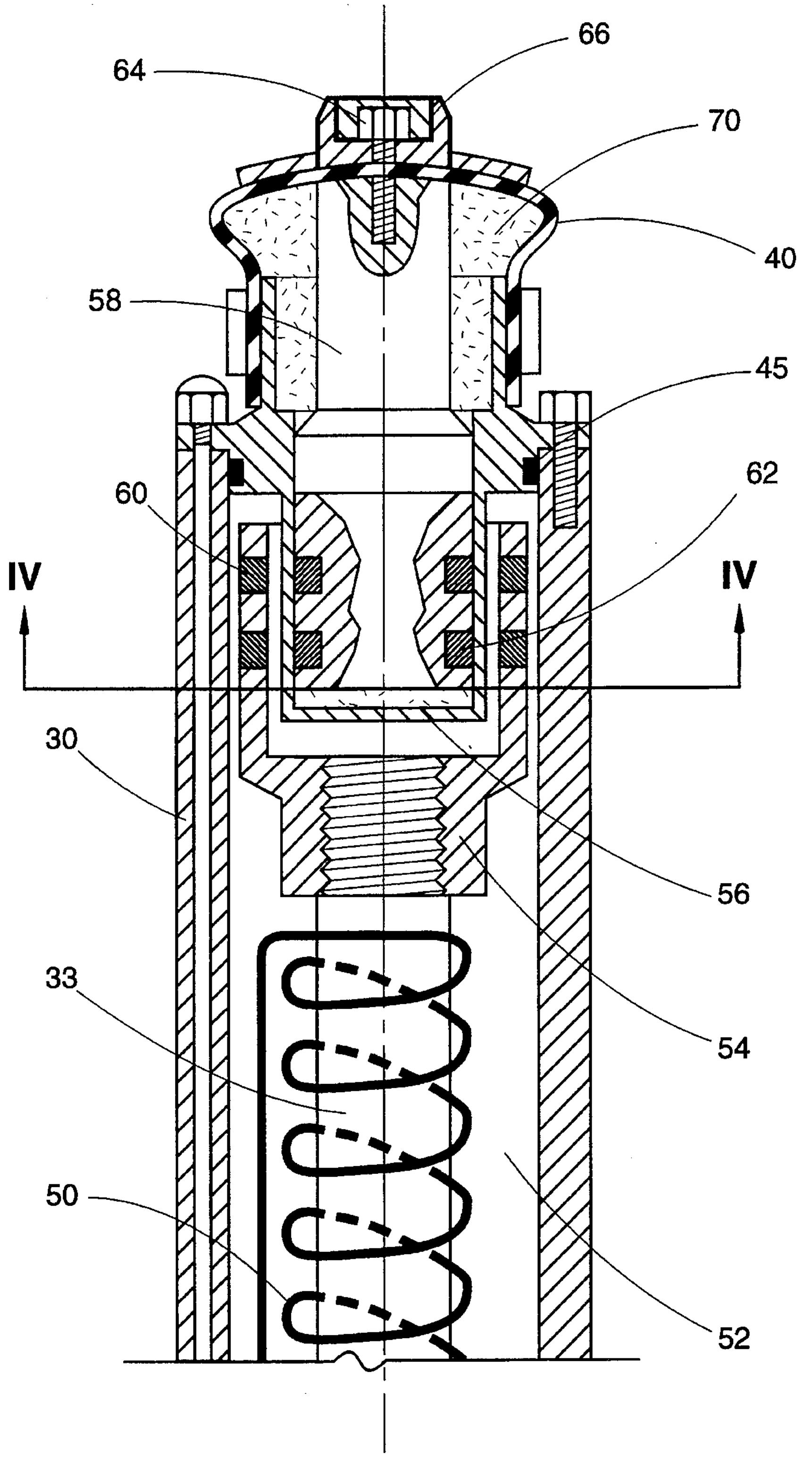
FIG. 3 is a cross-sectional view of another embodiment of the invention.

FIG. 3, utilizing like numbers from FIG. 1, shows still another embodiment of the pulser transmitter of the present invention. As can be seen in FIG. 3, the magnetostrictive bar 33 and surrounding electrical coil 50 are located in a sealed air filled cavity 52 separated from an oil filled cavity 70, membrane 40 and driven bar 58, by cover partition 56. An end detail 54 is connected to the end of the magnetostrictive bar 33, preferably by a threaded connection, however other removable connections could also be used such as bolts or clamps. The end detail 54 has a cylindrical shape with the end of the end detail 54 that is attached to the magnetostrictive bar 33 having a smaller diameter than the end of the end detail that is distal from the magnetostrictive bar. The axial movements of the bar 33 are transmitted through a cover partition 56 comprised of a nonmagnetic material such as bronze or plastic, to a driven bar 58 located in oil filled cavity 70, by means of permanent magnets. Multiple driving magnets 60 are attached along the internal diameter of the end detail 54. Multiple driven magnets 62, having an opposite polarity to the driving magnets 60, are located on the external diameter of the driven bar 58 and are in alignment with the corresponding driving magnets 60. Linear ball bearings (not shown) can also used to reduce friction between the driven bar 58 and cover partition 56 during the axial movements of the driven bar 58.

Driven bar 58 is attached to the flexible diaphragm 40 by means of screw 64 and screw holder 66. The flexible membrane 40, O-ring 45 and cover partition 56 form a sealed fluid cavity 70, preferably the fluid being oil. Flexible diaphragm 40 works as a pressure compensation means and is used to maintain the internal pressure of the fluid cavity in approximate equilibrium with the ambient drilling fluid. The driven bar 58 duplicates all axial movements of the magnetostrictive bar 33 and thereby transmits those movements to the flexible diaphragm 40. The flexible diaphragm 40 displacements generate pressure pulses in the ambient drilling fluid which then can be detected at the earth's surface.

Figure 4:
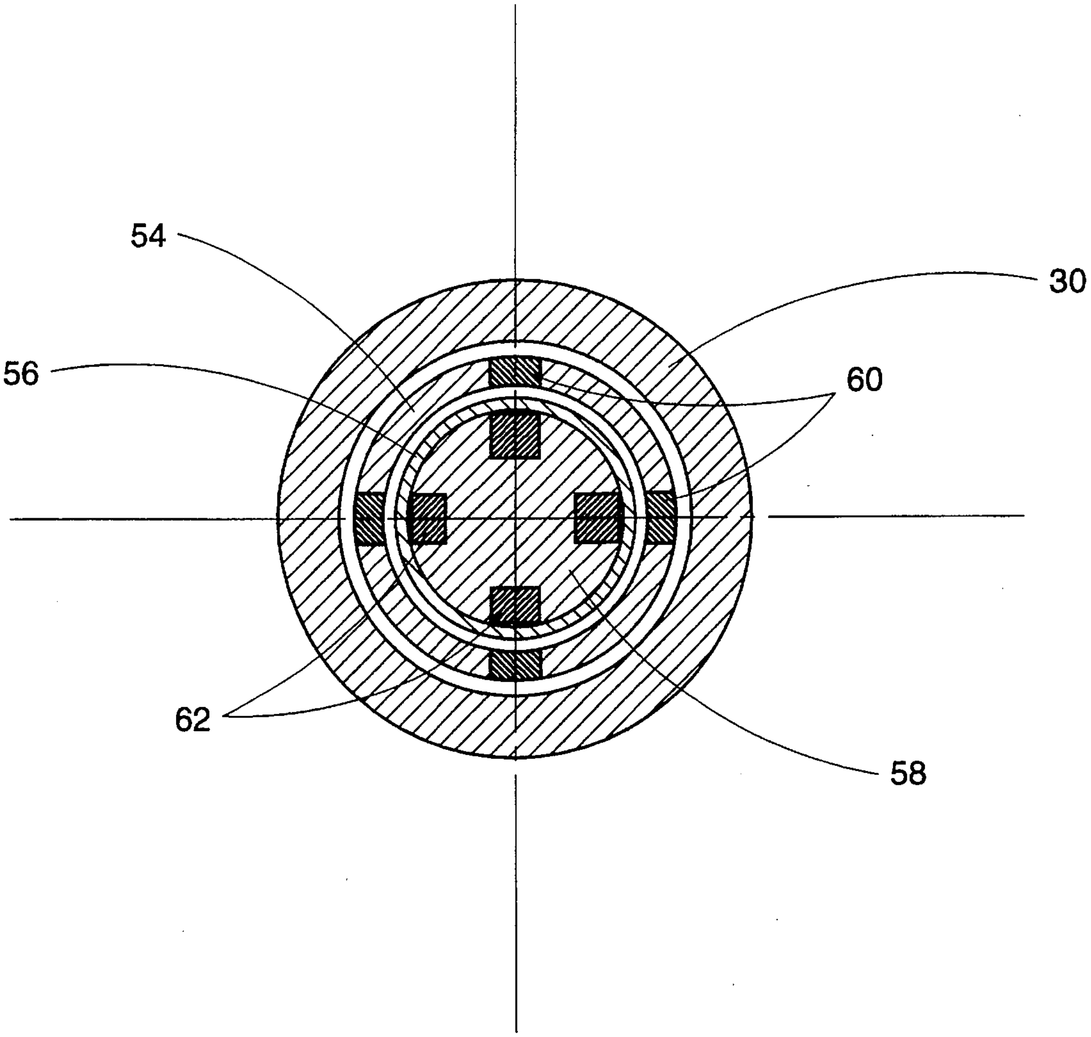
FIG. 4 is a cross-sectional view taken along lines IV—IV of FIG. 3.

FIG. 4 shows a cross-sectional view taken along lines IV—IV of FIG. 3. Like numbers have been used in FIG. 4 from FIG. 3. In FIG. 4 the relative relationship between the driving magnets 60 and driven magnets 62 can clearly be seen.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical application and enable others skilled in the art to utilize the invention in various embodiments and with various modifications as are suited to the particular use contemplated. It is intended that the scope of the invention be defined by the claims appended hereto.

I claim:

1. A downhole data transmission device for use in a borehole, comprising:

(a) electrical means for providing electrical power for the downhole data transmission device;

(b) sensor means for measuring downhole physical drilling parameters, said sensor means being in electrical communication with said electrical means;

(c) a sealed housing having a flexible membrane at an end proximate to the earth's surface, said sealed housing containing an internal fluid pressurized at a substantially equal pressure to a drilling fluid pressure in the borehole;

(d) a pulser transmitter within said sealed housing, said pulser transmitter having first and second ends and a longitudinal axis from said first to second ends, said first end of the pulser transmitter being removably secured to the housing, said pulser transmitter being comprised of a material capable of rapidly expanding longitudinally in response to the presence of a magnetic field and being further capable of rapidly contracting longitudinally to its original dimension in the absence of the magnetic field;

(e) an electrically conductive coil in radial proximity around said pulser transmitter between said pulser transmitter first and second ends;

(f) controller means, in electrical communication with said sensor means and electrical means, for providing electrical pulses through said electrically conductive coil, said electrical pulses corresponding to the measured downhole physical drilling parameters and being of sufficient magnitude to create a corresponding magnetic field pulse of a sufficient magnitude to cause the pulser transmitter to expand and contract longitudinally in the presence and absence, respectively, of the magnetic field pulse, said longitudinal expansion and contraction of the pulser transmitter creating pressure pulses in the internal pressurized fluid that are transmitted through the flexible membrane to the drilling fluid and detectable at the earth's surface.

2. The downhole data transmission device for claim 1 wherein the electrical means is a battery.

3. The downhole data transmission device of claim 1 wherein the electrical means is a turbine generator.

4. The downhole data transmission device of claim 1 wherein the pulser transmitter material is magnetostrictive material.

5. The downhole data transmission device of claim 4 wherein the magnetostrictive material is comprised of a tertiary rare earth alloy of terbium-dysprosium-iron.

6. The downhole data transmission device of claim 1 wherein the electrical pulse frequency is between 10 and 100 Hz.

7. A downhole data transmission device for use in a borehole, comprising:

(a) electrical means for providing electrical power for the downhole data transmission device;

(b) sensor means for measuring downhole physical conditions, said sensor means being in electrical communication with said electrical means;

(c) a sealed housing having a flexible membrane at an end proximate to the earth's surface, said sealed housing containing an internal fluid pressurized at a substantially equal pressure to a drilling fluid pressure in the borehole;

(d) a pulser transmitter within said sealed housing, said pulser transmitter having first and second ends and a longitudinal axis from said first to second ends, said first end of the pulser transmitter being removably secured to said housing and said second end of the pulser transmitter being removably secured to said flexible membrane, said pulser transmitter being comprised of a material capable of expanding longitudinally in response to the presence of a magnetic field and being further capable of contracting longitudinally to its original dimension in the absence of the magnetic field;

(e) an electrically conductive coil in radial proximity around said pulser transmitter between said pulser transmitter first and second ends;

(f) controller means, in electrical communication with said sensor means and electrical means, for providing electrical pulses through said electrically conductive coil, said electrical pulses corresponding to the measured downhole physical conditions and being of sufficient magnitude to create a corresponding magnetic field pulse of a sufficient magnitude to cause the pulser transmitter to expand and contract longitudinally in the presence and absence, respectively, of the magnetic field pulse, said longitudinal expansion and contraction of the pulser transmitter and flexible membrane creating pressure pulses directly in ambient drilling fluid and then detectable at the earth's surface.

8. The downhole data transmission device for claim 7 wherein the electrical means is a battery.

9. The downhole data transmission device of claim 7 wherein the electrical means is a turbine generator.

10. The downhole data transmission device of claim 7 wherein the pulser transmitter material is a magnetostrictive material.

11. The downhole data transmission of device of claim 10 wherein the magnetostrictive material is comprised of a tertiary rare earth alloy of terbium-dysprosium-iron.

12. The downhole data transmission device of claim 7 wherein the electrical pulse frequency is between 10 and 100 Hz.

13. A downhole data transmission device for use in a borehole, comprising:

(a) electrical means for providing electrical power for the downhole data transmission device;

(b) sensor means for measuring downhole physical conditions, said sensor means being in electrical communication with said electrical means;

(c) a sealed fluid filled cavity having a flexible membrane at an end proximate to the earth's surface, said sealed cavity containing an internal fluid pressurized at a substantially equal pressure to an ambient pressure in the borehole;

(d) a pulser transmitter located within an air cavity of a sealed housing, said pulser transmitter having first and second ends and a longitudinal axis from said first to second ends, said first end of the pulser transmitter being removably secured to the housing, said pulser transmitter being comprised of a material capable of rapidly expanding longitudinally in response to the presence of a magnetic field and being further capable of rapidly contracting longitudinally to its original dimension in the absence of the magnetic field;

(e) an electrically conductive coil in radial proximity around said pulser transmitter between said pulser transmitter first and second ends;

(f) controller means, in electrical communication with said sensor means and electrical means, for providing electrical pulses through said electrically conductive coil, said electrical pulses corresponding to the measured downhole physical conditions and being of sufficient magnitude to create a corresponding magnetic field pulse of a sufficient magnitude to cause the pulser transmitter to expand and contract longitudinally in the presence and absence, respectively, of the magnetic field pulse, said longitudinal expansion and contraction of the pulser transmitter and axial displacement of the flexible membrane creating pressure pulses directly in ambient drilling fluid in the borehole and then detectable at the earth's surface.

(g) mechanical transfer means connected between said second end of the pulser transmitter and said flexible membrane for transferring the pulser transmitter longitudinal expansion and contraction to the flexible membrane.

14. The downhole data transmission device for claim 13 wherein the electrical means is a battery.

15. The downhole data transmission device of claim 13 wherein the electrical means is a turbine generator.

16. The downhole data transmission device of claim 13 wherein the pulser transmitter material is a magnetostrictive material.

17. The downhole data transmission of device of claim 16 wherein the magnetostrictive material is comprised of a tertiary rare earth alloy of terbium-dysprosium-iron.

18. The downhole data transmission device of claim 13 wherein the electrical pulse frequency is between 10 and 100 Hz.

19. The downhole data transmission device of claim 13 wherein the mechanical transfer means utilizes a first plurality set of permanent magnets having the same polarity attached on the inside diameter of an cylindrical coupling which is attached to said pulser transmitter located in the air cavity and a corresponding second plurality set of permanent magnets having an opposite polarity to the first plurality set permanent magnets, said second plurality set of permanent magnets being attached on an outside diameter of a first end of a rigid bar located in the fluid filled cavity, said first end of the rigid bar being located within the internal diameter of said cylindrical coupling, a second end of the rigid bar being removably connected to the flexible membrane.

* * * * *